US007015082B2

(12) United States Patent
Doris et al.

(10) Patent No.: US 7,015,082 B2
(45) Date of Patent: Mar. 21, 2006

(54) HIGH MOBILITY CMOS CIRCUITS

(75) Inventors: Bruce B. Doris, Brewster, NY (US);
Oleg G. Gluschenkov, Poughkeepsie, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/701,526

(22) Filed: Nov. 6, 2003

(65) Prior Publication Data

US 2005/0098829 A1 May 12, 2005

(51) Int. Cl.
*H01L 21/00* (2006.01)
*H01L 21/84* (2006.01)
*H01L 21/336* (2006.01)
*H01L 21/8237* (2006.01)
*H01L 27/01* (2006.01)
*H01L 29/76* (2006.01)

(52) U.S. Cl. .................... 438/153; 438/154; 438/157; 438/197; 257/351; 257/368; 257/369; 257/635; 257/637; 257/639

(58) Field of Classification Search ................ 257/635, 257/637, 639, 351, 368, 369, 363; 438/769, 438/954, 153, 154, 157, 197
See application file for complete search history.

(56) References Cited

U.S. PATENT DOCUMENTS

| 3,602,841 | A | 8/1971 | McGroddy |
| 4,665,415 | A | 5/1987 | Esaki et al. |
| 4,853,076 | A | 8/1989 | Tsaur et al. |
| 4,855,245 | A | 8/1989 | Neppl et al. |
| 4,952,524 | A | 8/1990 | Lee et al. |
| 4,958,213 | A | 9/1990 | Eklund et al. |
| 5,006,913 | A | 4/1991 | Sugahara et al. |
| 5,060,030 | A | 10/1991 | Hoke |
| 5,081,513 | A | 1/1992 | Jackson et al. |
| 5,108,843 | A | 4/1992 | Ohtaka et al. |
| 5,134,085 | A | 7/1992 | Gilgen et al. |
| 5,310,446 | A | 5/1994 | Konishi et al. |
| 5,354,695 | A | 10/1994 | Leedy |
| 5,371,399 | A | 12/1994 | Burroughes et al. |
| 5,391,510 | A | 2/1995 | Hsu et al. |
| 5,459,346 | A | 10/1995 | Asakawa et al. |
| 5,471,948 | A | 12/1995 | Burroughes et al. |
| 5,557,122 | A | 9/1996 | Shrivastava et al. |
| 5,561,302 | A | 10/1996 | Candelaria |
| 5,565,697 | A | 10/1996 | Asakawa et al. |
| 5,571,741 | A | 11/1996 | Leedy |
| 5,592,007 | A | 1/1997 | Leedy |
| 5,592,018 | A | 1/1997 | Leedy |
| 5,670,798 | A | 9/1997 | Schetzina |

(Continued)

OTHER PUBLICATIONS

Kern Rim, et al., "Transconductance Enhancement in Deep Submicron Strained-Si n-MOSFETs", International Electron Devices Meeting, 26, 8, 1, IEEE, Sep. 1998.

(Continued)

*Primary Examiner*—Steven Loke
*Assistant Examiner*—Samuel A. Gebremariam
(74) *Attorney, Agent, or Firm*—Joseph P. Abate; Greenblum & Bernstein P.L.C.

(57) ABSTRACT

A semiconductor device has selectively applied thin tensile films and thin compressive films, as well as thick tensile films and thick compressive films, to enhance electron and hole mobility in CMOS circuits. Fabrication entails steps of applying each film, and selectively removing each applied film from areas that would not experience performance benefit from the applied stressed film.

12 Claims, 14 Drawing Sheets

U.S. PATENT DOCUMENTS

| | | | |
|---|---|---|---|
| 5,679,965 | A | 10/1997 | Schetzina |
| 5,683,934 | A | 11/1997 | Candelaria |
| 5,840,593 | A | 11/1998 | Leedy |
| 5,861,651 | A | 1/1999 | Brasen et al. |
| 5,880,040 | A | 3/1999 | Sun et al. |
| 5,940,736 | A | 8/1999 | Brady et al. |
| 5,946,559 | A | 8/1999 | Leedy |
| 5,960,297 | A | 9/1999 | Saki |
| 5,989,978 | A | 11/1999 | Peidous |
| 6,008,126 | A | 12/1999 | Leedy |
| 6,025,280 | A | 2/2000 | Brady et al. |
| 6,046,464 | A | 4/2000 | Schetzina |
| 6,066,545 | A | 5/2000 | Doshi et al. |
| 6,090,684 | A | 7/2000 | Ishitsuka et al. |
| 6,107,143 | A | 8/2000 | Park et al. |
| 6,117,722 | A | 9/2000 | Wuu et al. |
| 6,133,071 | A | 10/2000 | Nagai |
| 6,165,383 | A | 12/2000 | Chou |
| 6,221,735 | B1 | 4/2001 | Manley et al. |
| 6,228,694 | B1 | 5/2001 | Doyle et al. |
| 6,235,574 | B1 * | 5/2001 | Tobben et al. ............ 438/241 |
| 6,246,095 | B1 | 6/2001 | Brady et al. |
| 6,255,169 | B1 | 7/2001 | Li et al. |
| 6,261,964 | B1 | 7/2001 | Wu et al. |
| 6,265,317 | B1 | 7/2001 | Chiu et al. |
| 6,274,444 | B1 | 8/2001 | Wang |
| 6,281,532 | B1 | 8/2001 | Doyle et al. |
| 6,284,623 | B1 | 9/2001 | Zhang et al. |
| 6,284,626 | B1 | 9/2001 | Kim |
| 6,319,794 | B1 | 11/2001 | Akatsu et al. |
| 6,361,885 | B1 | 3/2002 | Chou |
| 6,362,082 | B1 | 3/2002 | Doyle et al. |
| 6,368,931 | B1 | 4/2002 | Kuhn et al. |
| 6,403,486 | B1 | 6/2002 | Lou |
| 6,403,975 | B1 | 6/2002 | Brunner et al. |
| 6,406,973 | B1 | 6/2002 | Lee |
| 6,461,936 | B1 | 10/2002 | von Ehrenwall |
| 6,476,462 | B1 | 11/2002 | Shimizu et al. |
| 6,483,154 | B1 * | 11/2002 | Ngo et al. ................ 257/384 |
| 6,493,497 | B1 | 12/2002 | Ramdani et al. |
| 6,498,358 | B1 | 12/2002 | Lach et al. |
| 6,501,121 | B1 | 12/2002 | Yu et al. |
| 6,506,652 | B1 | 1/2003 | Jan et al. |
| 6,521,964 | B1 | 2/2003 | Jan et al. |
| 6,531,369 | B1 | 3/2003 | Ozkan et al. |
| 6,531,740 | B1 | 3/2003 | Bosco et al. |
| 6,573,172 | B1 * | 6/2003 | En et al. ................... 438/626 |
| 6,509,618 | B1 | 7/2003 | Jan et al. |
| 2001/0009784 | A1 | 7/2001 | Ma et al. |
| 2002/0074598 | A1 | 6/2002 | Doyle et al. |
| 2002/0086472 | A1 | 7/2002 | Roberds et al. |
| 2002/0086497 | A1 | 7/2002 | Kwok |
| 2002/0090791 | A1 | 7/2002 | Doyle et al. |
| 2003/0032261 | A1 | 2/2003 | Yeh et al. |
| 2003/0040158 | A1 | 2/2003 | Saitoh |
| 2003/0057184 | A1 | 3/2003 | Yu et al. |
| 2003/0067035 | A1 | 4/2003 | Tews et al. |
| 2004/0135234 | A1 * | 7/2004 | Morin et al. ............... 257/635 |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp 98-99.

Gregory Scott, et al., "NMOS Drive Current Reduction Caused by Transistor Layout and Trench Isolation Induced Stress", International Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya Ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

* cited by examiner

HIGH MOBILITY CMOS CIRCUITS

BACKGROUND OF THE INVENTION

1. Field of the Invention

The invention generally relates to a semiconductor device and method of manufacture and, more particularly, to a complementary metal-oxide-semiconductor (CMOS) device that includes an etch stop layer with a selectively varying thickness.

2. Background Description

As semiconductor devices continue to evolve towards higher densities of circuit elements, the performance of materials used for the devices becomes more critical to overall performance, such as charge carrier mobility. CMOS devices fabricated on substrates having a thin strained silicon (Si) layer on a relaxed SiGe buffer layer exhibit substantially higher electron and hole mobility in strained Si layers than in bulk silicon layers. Furthermore, metal oxide semiconductor field effect transistors (MOSFETs) with strained Si channels exhibit enhanced device performance compared to devices fabricated in conventional (unstrained) silicon substrates. Unfortunately, however, as Ge concentrations increase to a level required to enhance performance of p-channel field effect transistors, so does defect density.

Another approach for achieving performance enhancement involves imparting local mechanical stresses. Electron mobility and, thus, n-channel field effect transistor (nFET) performance may be improved by imparting tensile stress either along (i.e., parallel to) the direction of a current flow and/or orthogonal to the direction of current flow. Additionally, hole mobility and, thus, p-channel field effect transistor (PFET) performance, may be enhanced by imparting compressive stress parallel to the direction of current flow and tensile stress perpendicular to the direction of current flow.

Etch stop films may be applied to impart tensile and compressive stresses. For example, a tensile stress may be imparted to an NFET channel by applying a tensile etch stop film. A compressive stress may be imparted to a pFET channel by applying a compressive etch stop film. However, such an approach has drawbacks. In particular, the compressive film degrades NFET performance, while the tensile film degrades pFET performance.

Furthermore, although etch stop films may be configured to impart significant stresses, relatively thick films are required as the stress transferred is proportional to film thickness. Problematically, as film thickness increases, voids are likely to form in the film. This is especially true in dense structures, such as cache or SRAM cells, where gates are very closely spaced, e.g., at a minimum pitch. During contact etching, such voids may open and fill with contact metal. As the voids run parallel to the gates, the voids filled with contact metal may cause contact shorts, thereby preventing proper circuit functionality.

The invention is directed to overcoming one or more of the problems as set forth above.

SUMMARY OF THE INVENTION

In a first aspect of the invention, a semiconductor structure is provided. The structure includes a plurality of field effect transistors and first and second stress layers deposited on portions of the field effect transistors. The plurality of field effect transistors include a first portion of field effect transistors and a second portion of field effect transistors. A first stress layer has a first thickness and is configured to impart a first determined stress to the first portion of the plurality of field effect transistors. A second stress has a second thickness and is configured to impart a second determined stress to the second portion of the plurality of field effect transistors.

Furthermore, in an exemplary embodiment, areas of the semiconductor that would not experience performance enhancement due to the stress imparted by the first stress layer are devoid of the first stress layer. Likewise, areas of the semiconductor that would not experience performance enhancement due to the stress imparted by the second stress layer are devoid of the second stress layer. The imparted stresses may be compressive and/or tensile. Additionally, the first and second stress layers may have the same or different thicknesses.

In another aspect of the invention a semiconductor structure formed on a substrate includes a first plurality of n-channel field effect transistors having a first range of spacings between adjacent n-channel field effect transistors that fall within a first defined spacing range. The structure also includes a second plurality of n-channel field effect transistors having a second range of spacings between adjacent n-channel field effect transistors that fall within a second defined spacing range. Additionally, the structure includes a first plurality of p-channel field effect transistors having a first range of spacings between adjacent p-channel field effect transistors that fall within a first defined spacing range. Furthermore, the structure includes a second plurality of p-channel field effect transistors having a second range of spacings between adjacent p-channel field effect transistors that fall within a second defined spacing range.

A first tensile layer having a first tensile layer thickness and being configured to impart a first determined tensile stress is applied to the first plurality of n-channel field effect transistors. A second tensile layer having a second tensile layer thickness and being configured to impart a second determined tensile stress is applied to the second plurality of n-channel field effect transistors. A first compressive layer having a first compressive layer thickness and being configured to impart a first determined compressive stress is applied to the first plurality of p-channel field effect transistors. A second compressive layer having a second compressive layer thickness and being configured to impart a second determined compressive stress is applied to the second plurality of p-channel field effect transistors.

In a further aspect of the invention, a process of forming a semiconductor structure is provided. The process entails forming a semiconductor substrate. Next, a plurality of field effect transistors are formed on the semiconductor substrate. The plurality of field effect transistors includes a first portion of field effect transistors and a second portion of field effect transistors. Subsequently, a first stress layer is deposited. The first stress layer has a first thickness and is configured to impart a first determined stress to the first portion of the plurality of field effect transistors. A second stress layer is also deposited. The second stress layer has a second thickness and is configured to impart a second determined stress to the second portion of the plurality of field effect transistors.

Furthermore, in an exemplary implementation, portions of the first stress layer may be removed from areas of the semiconductor that would not experience performance enhancement due to the stress imparted by the first stress layer. Likewise, portions of the second stress layer may be removed from areas of the semiconductor that would not experience performance enhancement due to the stress imparted by the second stress layer. The imparted stresses may be compressive and/or tensile. Additionally, the first and second stress layers may have the same or different thicknesses.

DETAILED DESCRIPTION OF EMBODIMENTS OF THE INVENTION

The invention employs selectively applied thin stressed films, such as tensile films, thin compressive films, and thick tensile films, to enhance electron and hole mobility in CMOS circuits. An exemplary process in accordance with the invention entails steps of applying each film, and patterning for selectively removing the applied film from areas that would not experience performance benefit from the applied stressed film.

Figure 1:
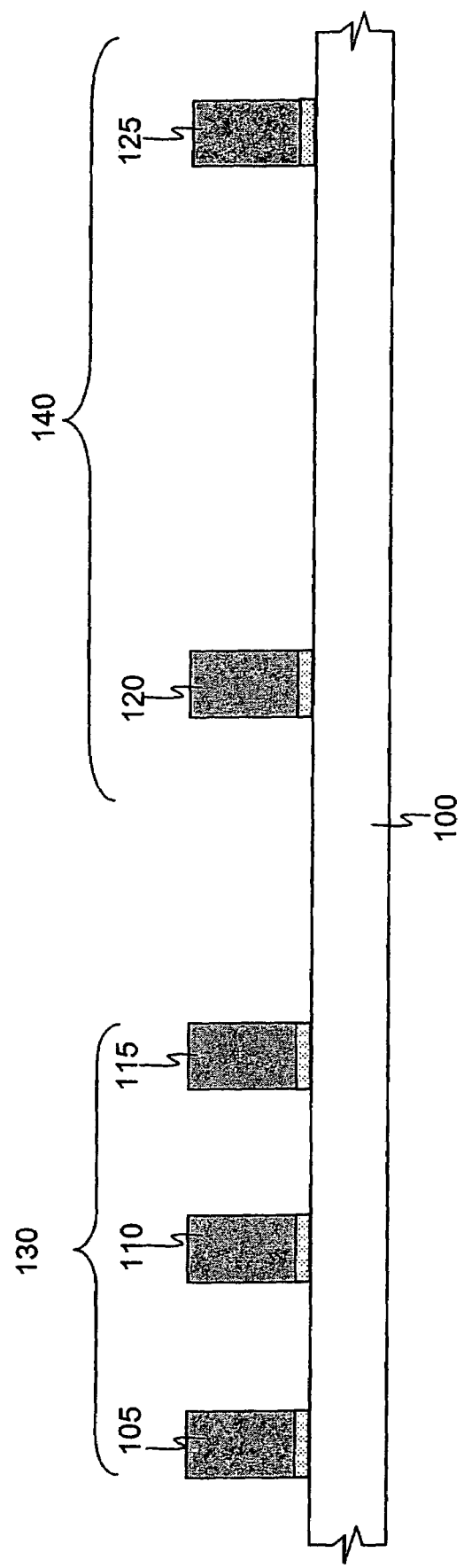
FIG. 1 shows a CMOS device having a plurality of FETS (i.e., NFETS and/or PFETS)

Referring now to FIG. 1, a substrate 100 having a plurality of FETS (i.e., NFETS and/or PFETS) 105–125 is shown. The substrate 100 includes areas of different densities of nFETS and pFETs, including areas of high concentration or density 130 and areas of low concentration or density 140. Typically, similar devices are clustered; though the invention is applicable to devices having nFETs interspersed with pFETs, and vice versa.

The high density area 130 exhibits closely spaced FETs. In such an area, the distance from gate to gate may, for example, be 130 nanometers (nanometers). As used herein, a high density area refers to an area with closely spaced FETs, even if there are only two FETs in the area. The low density or isolated area 140 exhibits FETs with a relatively substantial distance from gate to gate. In such an area, the distance from gate to gate may, for example, be 200 nanometers or greater. The substrate 100, including the FETs 105–125, may be fabricated in a conventional manner. While FIGS. 1 through 14 illustrate principles of exemplary implementations of the invention, they are not drawn to scale. Thus, the dimensions, proportions and spacings of device elements may differ from those depicted in the Figures.

The stress layer influences what is considered a dense or isolated area. A dense area would not be able to accommodate a thick stress layer without a substantial likelihood of void formation. The thicker the layer, the more space it requires to avoid undesirable void formation. Additionally, some stress layer materials and depositing parameters may be more conducive to void formation than others. Conversely, an isolated area is able to accommodate a thick stress layer without a substantial likelihood of void formation. While layer thicknesses and distances between FETs are provided herein for illustrative purposes, those skilled in the art should appreciate that the invention is not limited to the specifically provided thicknesses and distances.

Etch stop films (or layers) applied as stress layers in accordance with the invention may include refractory insulating material or materials with selective etch and physical properties. By way of example, silicon nitride $Si_3N_4$ or $Si_xN_y$, and/or silicon oxynitride $Si_xON_y$, may be used for stress films. These materials may be grown or blanket deposited in a conventional manner, such as by chemical vapor deposition (CVD), plasma enhanced CVD or physical vapor deposition (PVD). Such films can be made with a well controlled thickness. Illustratively, the thickness range may be between 50 to 300 nanometers for a thick film, and 20 to 50 nanometers for a thin film. Etch stop films applied in accordance with the principles of the invention act primarily as stress inducing layers.

Stress in applied films may be controlled in a conventional manner. For example, to control the stress qualities of the film, the deposition pressure and/or plasma power and/or other deposition process parameters may be varied illustratively, without limiting the scope of the invention, to achieve a tensile film exhibiting a tensile stress of approximately 700 MPa, the following CVD parameters may be used: a temperature of approximately 480° C., a pressure of approximately 6.25 Torr, a spacing between the wafer and the electrode of 490 mils, a flow of 300 sccm of 2% dilute $SiH_4$ gas, 15 sccm $NH_3$ gas and 1060 sccm $N_2$ gas using RF power of 340 watts. Likewise, without limiting the scope of the invention, to achieve a compressive film exhibiting a compressive stress of approximately −1400 MPa, the following CVD parameters may be used: a temperature of approximately 480° C., a pressure of approximately 5.75 Torr, a spacing between the wafer and the electrode of 395 mils, a flow of 3000 sccm of 2% dilute $SiH_4$ gas, 15 sccm $NH_3$ gas and 1060 sccm $N_2$ gas using RF power of 900 watts. Adjusting the deposition process parameters allows control over properties of the deposited material, including physical properties such as stress properties.

In accordance with the invention, FETs of different spacings (i.e., densities or concentrations) may have stressed films of different thicknesses. In an exemplary implementation, closely spaced nFETs may have a thin tensile film to enhance electron mobility and, thus, NFET performance, while avoiding formation of undesirable voids. Likewise, closely spaced pFETs may have a thin compressive film to enhance hole mobility and, thus, pFET performance, again while avoiding formation of undesirable voids. Similarly, pFETs closely spaced to nFETs would also have thin stressed films. Furthermore, nFETs having a minimum spacing large enough to avoid void formation when a thick film is applied, may have a thick tensile film, while similarly spaced pFETs may have a thick compressive film. Of course, nFETs and pFETs may each be further divided into more than two categories, with each category exhibiting a range of distances between FETs, and each category capable of accommodating a stressed film layer of a determined thickness without substantial risk of undesirable void formation. A stressed etch stop film of a determined thickness or range of thicknesses will apply to each category.

Figure 2:
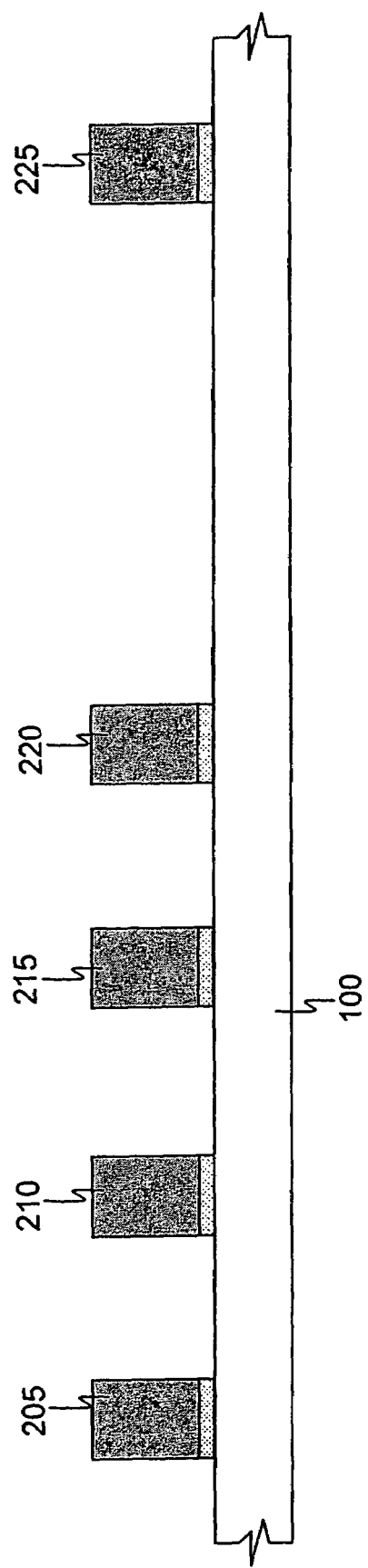
FIG. 2 shows a plurality of FETs, including a dense group of (i.e., a group of closely spaced) nFETs, on a semiconductor device.

In one implementation, nFETs and pFETs may each be divided into two categories, i.e., a dense category of closely spaced FETs 130 and an isolated category of distantly spaced FETs 140, as shown in FIG. 1. Referring now to FIG. 2, a dense group of (i.e., a group of closely spaced) nFETs 205–220 and an isolated FET 225 are shown. In this implementation, the dense group is spaced at about 130 nanometers or less, while the isolated FET 225 may exhibit a spacing of greater than 130 nanometers.

Figure 3:
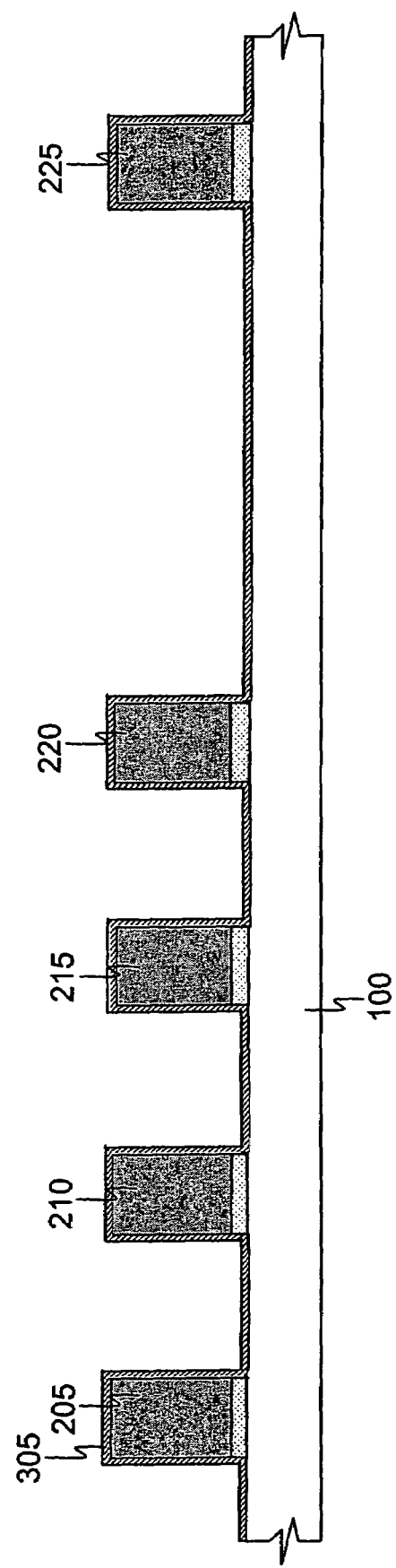
FIG. 3 shows a thin tensile stress layer applied to the plurality of FETs from FIG. 2, including the dense group of nFETs.

To impart a tensile stress to the nFETs 205–220, particularly the channel region of the nFETs 205–220, in accordance with the principles of the invention, a tensile stress layer 305 is applied over the entire surface of the semiconductor device, as shown in FIG. 3 and discussed more fully below. Because the nFETs 205–220 are closely spaced, a thin tensile layer is applied. The applied tensile layer 305 is then removed, such as by masking and etching, from areas of the device that do not benefit from the imparted tensile stress as well as from areas that may benefit from an alternative stress layer, such as the isolated FET 225.

A thin oxide (e.g., SiO$_2$) liner (not shown) may be applied, to serve as an etch stop, before the tensile stress layer 305 is applied. The oxide liner may be approximately 1 to 10 nanometers in thickness. The oxide liner guards against unintended etching of the structure and elements beneath the applied liner and stress layers. Alternatively, a timed etch, such as a timed dry etch, may be used to remove only the applied tensile layer from those areas of the substrate 100 that do not benefit from the imparted tensile stress.

Referring still to FIG. 3, the thin stressed film 305 may be comprised of, for example, Si$_3$N$_4$. The thin stressed film may also be, for example, Si$_x$N$_y$, and/or silicon oxynitride Si$_x$ON$_y$. The film 305 may be blanket deposited over the entire surface of the substrate 100 in a conventional manner, such as by CVD, plasma enhanced CVD or PVD. In one implementation, the thin stressed film may have a thickness between 20 to 50 nanometers. The spacing of the closely packed nFETs is about 130 nanometers or less. The film 305 may exhibit a tensile stress of approximately 600 to 1500 MPa (Mega-pascals). The film 305 is thus configured to impart a tensile stress to the underlying areas.

Figure 4:
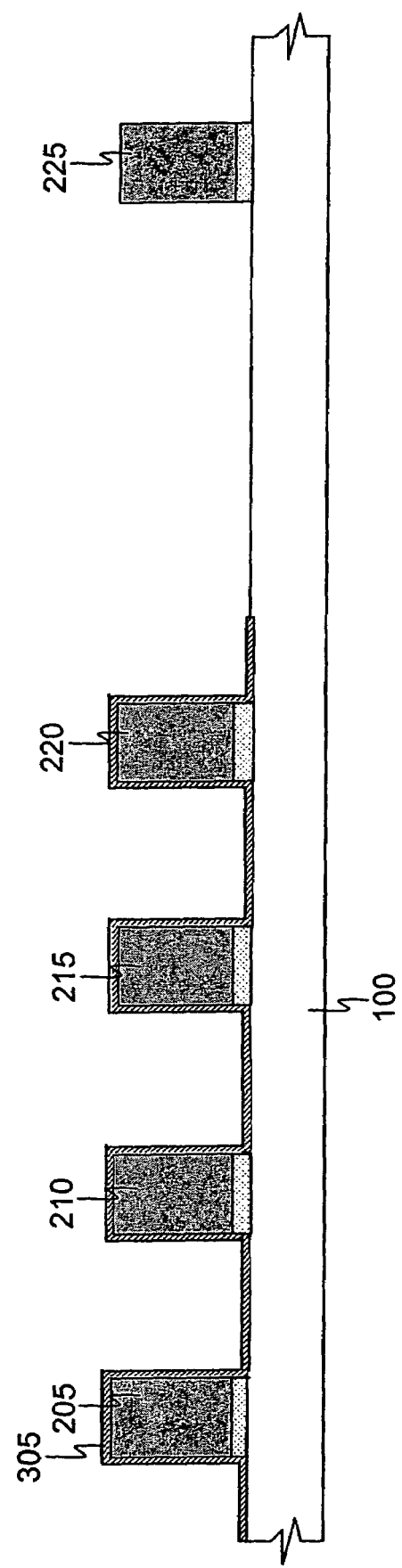
FIG. 4 shows the thin tensile stress layer removed from all areas except the dense group of nFETs.

Next, the thin tensile film 305 is masked on locations where the dense nFETs 205–220 are present, and possibly where isolated nFETs are present, to allow removal from all other areas (e.g., FET 225) of the substrate 100. For example, the desired pattern of nFETs may be transferred to an optical mask, as is well known in the art. The surface of the substrate 100 may then be covered with photoresist. The resist may then be exposed through the mask to radiation that changes its structure, polymerizing (i.e., cross linking) determined areas. Unpolymerized regions may then be removed using a solvent, leaving the polymerized portions in tact. Subsequent process steps (e.g., etching) will affect only the areas without polymerized photoresist. Thus, the thin tensile film may be removed by etching (e.g., by reactive ion etching using the patterned photoresist as a mask) from all areas (e.g., FET 225) except where the patterned nFETs (e.g., nFETs 205–220) are present, as shown in FIG. 4. Subsequently, any remaining polymerized photoresist may be removed using a wet process, such as sulfuric acid, or a dry process, such as O$_2$ plasma.

Figure 5:
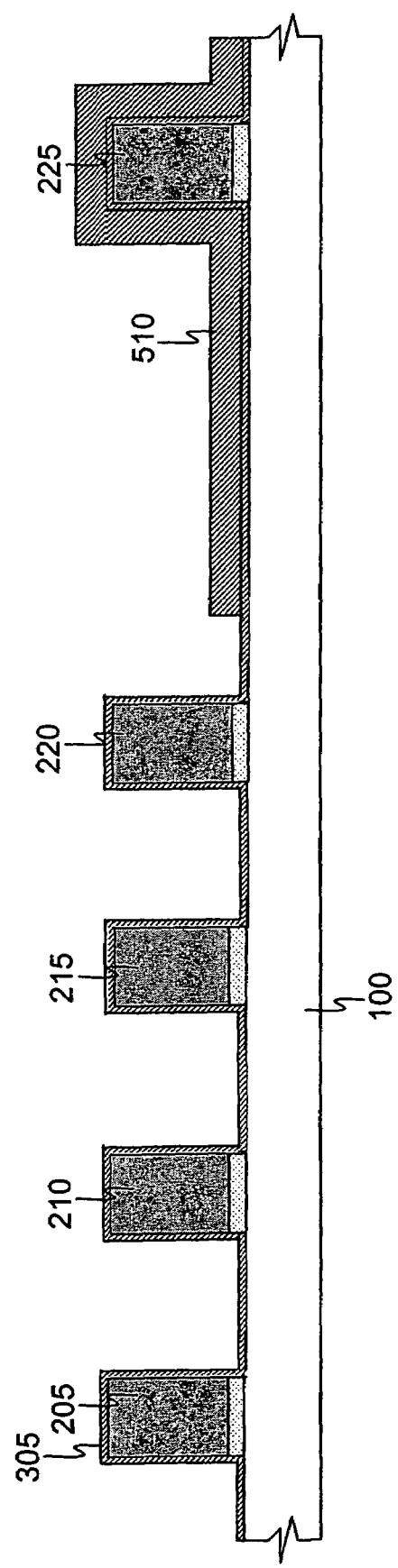
FIG. 5 shows the thin tensile stress layer on a dense group of nFETs and an isolated NFET, and a thick tensile layer on the isolated NFET.

As discussed above, the thin tensile layer 305 may be left on isolated NFETS as shown in FIG. 5. Additional thin (e.g., 20 to 50 nanometers) tensile layers and/or a thick (e.g., 50 to 500 nanometers) tensile layer 510 may subsequently be added to the isolated nFETs, such as in a manner described more fully below, to impart greater tensile stress and thereby achieve further enhancement of electron mobility. Alternatively, the thin tensile layer 305 may be removed from the isolated NFETS; in which case, the isolated nFETs may subsequently receive a thick (e.g., 50 to 500 nanometers) tensile layer to enhance electron mobility, as discussed more fully below. Similarly, thin and thick compressive stress layers may be applied to isolated pFETs, as discussed more fully below.

Subsequently, another oxide liner layer (not shown) may be deposited over the top surface of the entire device to serve as an etch stop, before the next stress layer is applied, as discussed below. The oxide liner guards against unintended etching of elements beneath it, including thin tensile stress layer 305. Alternatively, a timed etch, such as a timed dry etch, may be used to remove only the next layer from those areas of the substrate 100 that do not benefit from the imparted stress.

Figure 6:
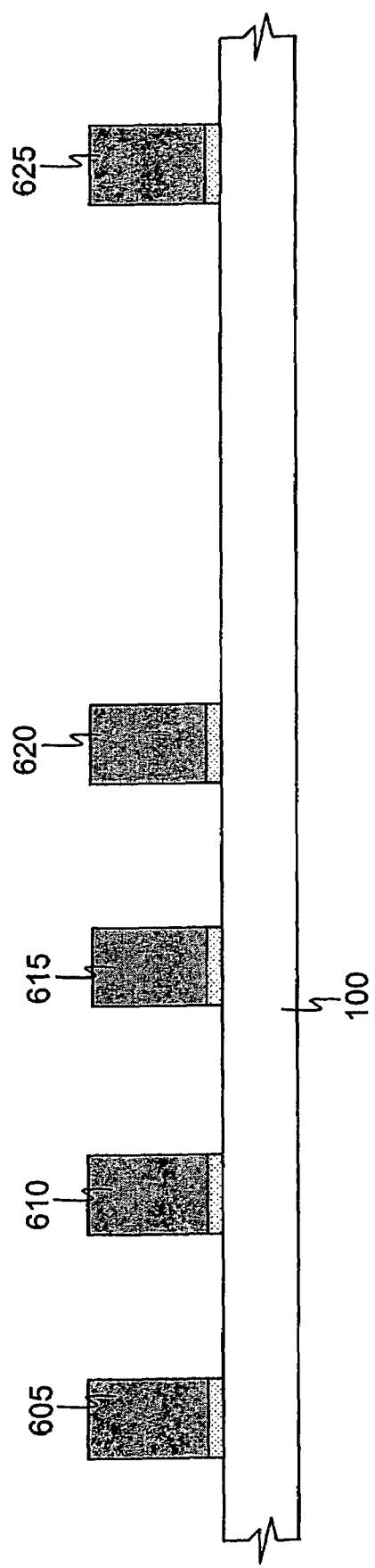
FIG. 6 shows a plurality of FETs, including a dense group of (i.e., a group of closely spaced) pFETs, on a semiconductor device.
Figure 7:
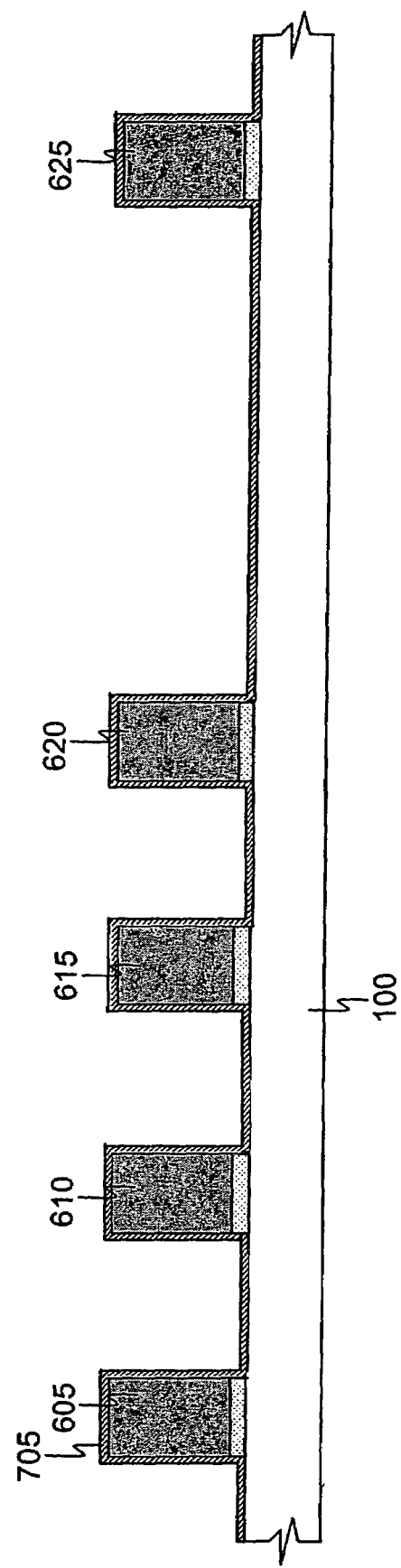
FIG. 7 shows a thin compressive stress layer applied to the plurality of FETs from FIG. 5, including the dense group of pFETs.

Referring now to FIG. 6, a dense group of (i.e., a group of closely spaced) pFETs 605–620 and an isolated FET 625 are shown. In one implementation, the dense group of pFETs 605–620 is spaced at about 130 nanometers or less. To impart a compressive stress to the dense group of pFETs 605–620, particularly the channel region of the pFETs 605–620, in accordance with the principles of the invention, a thin compressive stress layer 705 is applied to the surface of the entire device, as shown in FIG. 7.

The thin compressive layer 705 may be comprised of, for example, Si$_3$N$_4$. Alternatively, the thin compressive film may be Si$_x$N$_y$, and/or silicon oxynitride Si$_x$ON$_y$. The film 705 may be blanket deposited over the entire surface of the substrate 100 in a conventional manner, such as by CVD, plasma enhanced CVD or PVD. In one implementation, the thin compressive film may have a thickness between 20 to 50 nanometers. The thin compressive film 705 may exhibit a compressive stress of approximately −600 to −1500 MPa (Mega-pascals). The film 705 is thus configured to impart a compressive stress to underlying areas.

Figure 8:
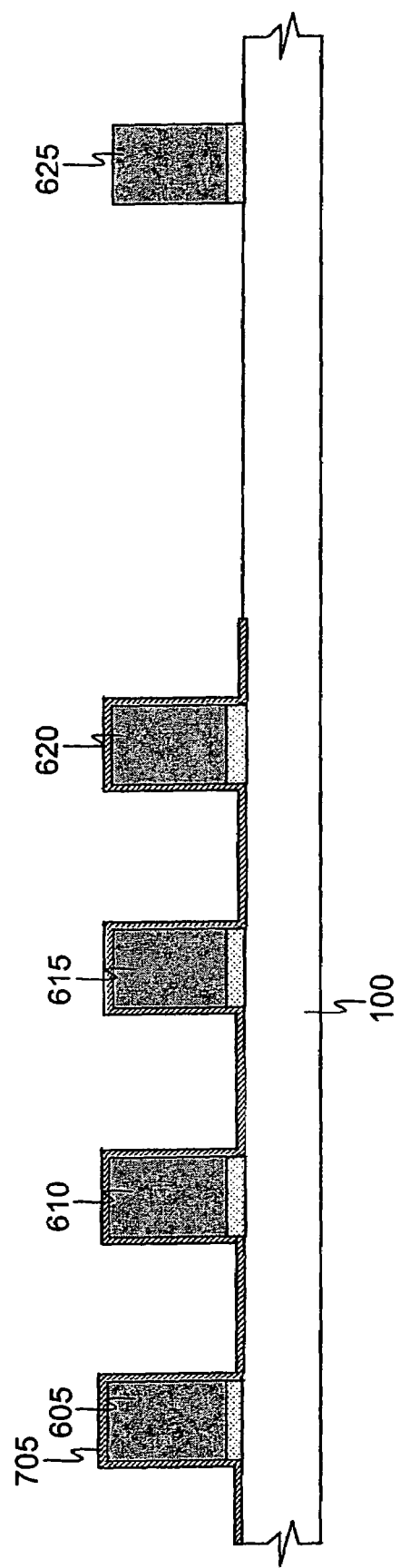
FIG. 8 shows the thin compressive stress layer removed from all areas except the dense group of pFETs.

Next, the thin compressive film 705 may be masked on locations where the dense pFETs 605–620 are present, and possibly where isolated pFETs are present, to allow removal from all other areas of the substrate 100. For example, the desired pattern of pFETs may be transferred to an optical mask in a conventional manner. The surface of the substrate 100 may then be covered with photoresist. The resist may then be exposed through the mask to radiation that changes its structure, polymerizing (i.e., cross linking) determined areas. Unpolymerized regions may then be removed using a solvent, leaving the polymerized portions in tact. Subsequent process steps (e.g., etching) will affect only the areas without polymerized photoresist. Thus, the thin compressive film 705 may be removed by etching (e.g., by reactive ion etching using the patterned photoresist as a mask) from all areas (e.g., FET 625) except where the patterned pFETs (e.g., nFETs 605–620) are present, as shown in FIG. 8.

Subsequently, the polymerized photoresist may be removed using a wet process, such as sulfuric acid, or a dry process, such as O$_2$ plasma.

As discussed above, the thin compressive layer 705 may be left on isolated pFETS. Additional thin (e.g., 20 to 50 nanometers) compressive layers and/or a thick (e.g., 50 to 500 nanometers) compressive layer may subsequently be added to isolated pFETs in a manner described above to impart greater compressive stress (e.g., −600 to −1500 MPa) and thereby achieve further enhancement of hole mobility. Alternatively, the thin compressive layer 705 may be removed from the isolated pFETS 625 as shown in FIG. 8; in which case, the isolated pFETs 625 may subsequently receive a thick compressive layer to enhance hole mobility, as discussed more fully below.

Subsequently, another oxide liner layer (not shown) may be deposited over the top surface of the entire device to serve as an etch stop, before the next stress layer is applied, as discussed below. The oxide liner thus guards against unintended etching of elements beneath it, including thin compressive stress layer 705. Alternatively, a timed etch, such as a timed dry etch, may be used to remove only the next layer from those areas of the substrate 100 that do not benefit from the stress imparted by the next layer.

Figure 9:
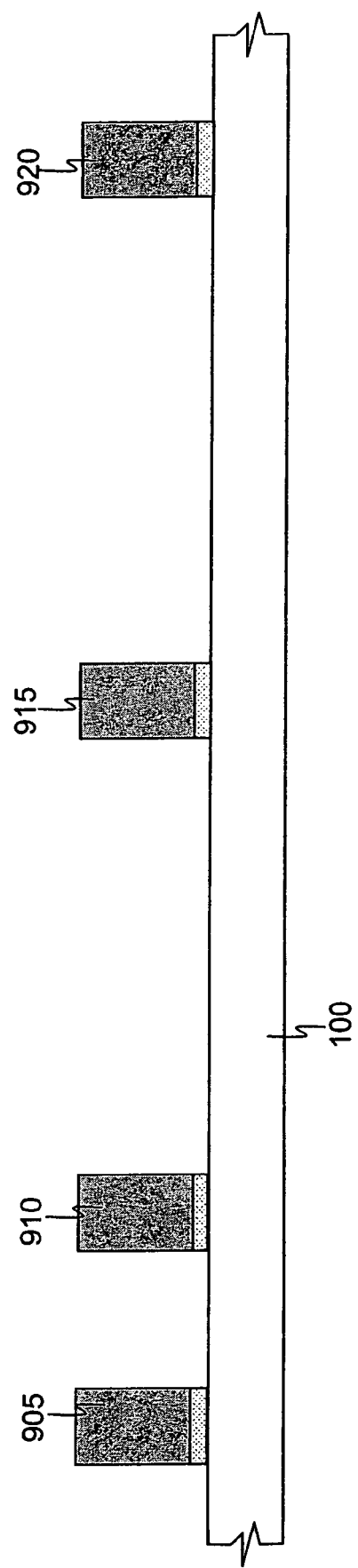
FIG. 9 shows a plurality of FETs, including a group of distantly spaced nFETs, on a semiconductor device.
Figure 10:
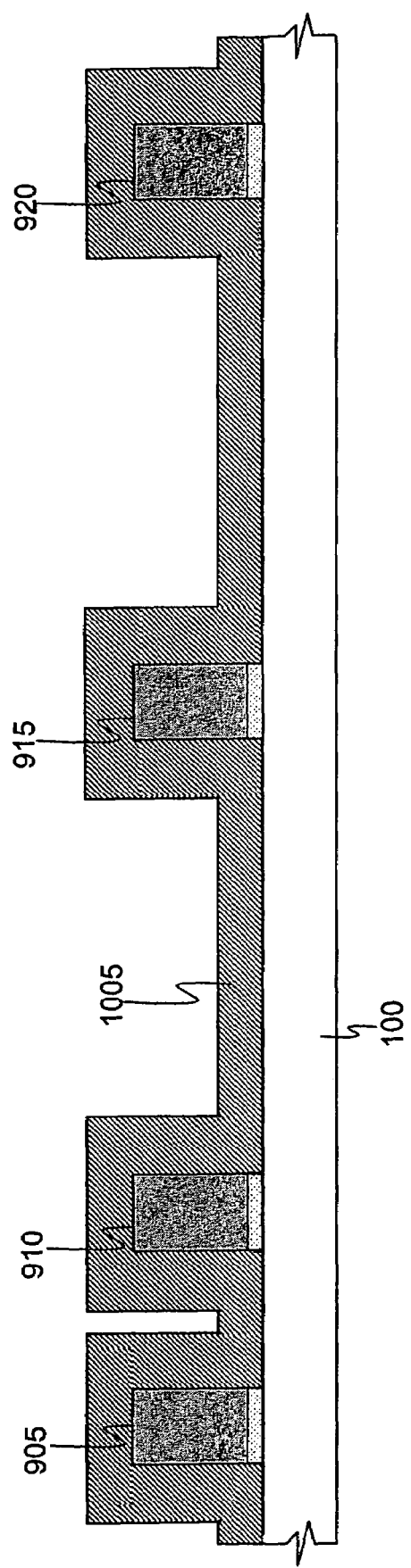
FIG. 10 shows a thick tensile stress layer applied to the plurality of FETs from FIG. 9, including the group of distantly spaced nFETs.

Referring now to FIG. 9, a sparsely populated group of (i.e., a group of distantly spaced) nFETs 915, 920 and a dense group of FETs 905, 910 are shown. The sparsely populated group of nFETs is spaced at about 130 nanometers or greater. To impart a tensile stress to the nFETs 915, 920, particularly the channel region of the nFETs 915, 920, in accordance with the principles of the invention, a tensile stress layer 1005 is applied to the surface of the entire substrate 100, as shown in FIG. 10. Because the nFETs 915, 920 are separated by a relatively substantial distance, a thick stress layer 1005 may be applied without substantial risk of void formation. Those skilled in the art will appreciate that, depending upon the order in which stress layers are added, and depending upon the type of FETs, FETs 905 and 910 may have stress layer (not shown in FIG. 10) beneath layer 1005. Alternatively, a stress layer suitable for FETs 905 and 910 may be added after stress layer 1005 is added.

The thick tensile film 1005 may be comprised of, for example, Si$_3$N$_4$. The thick tensile film may also be, for example, Si$_x$N$_y$, and/or silicon oxynitride Si$_x$ON$_y$. The film 1005 may be blanket deposited over the entire surface of the substrate 100 in a conventional manner, such as by CVD, plasma enhanced CVD or PVD. In one implementation, the thick tensile film may have a thickness between 50 to 300 nanometers. The thick tensile film 1005 may exhibit a tensile stress of approximately 600 to 1500 MPa (Mega-pascals). The film 1005 is thus configured to impart a tensile stress to underlying areas.

Figure 11:
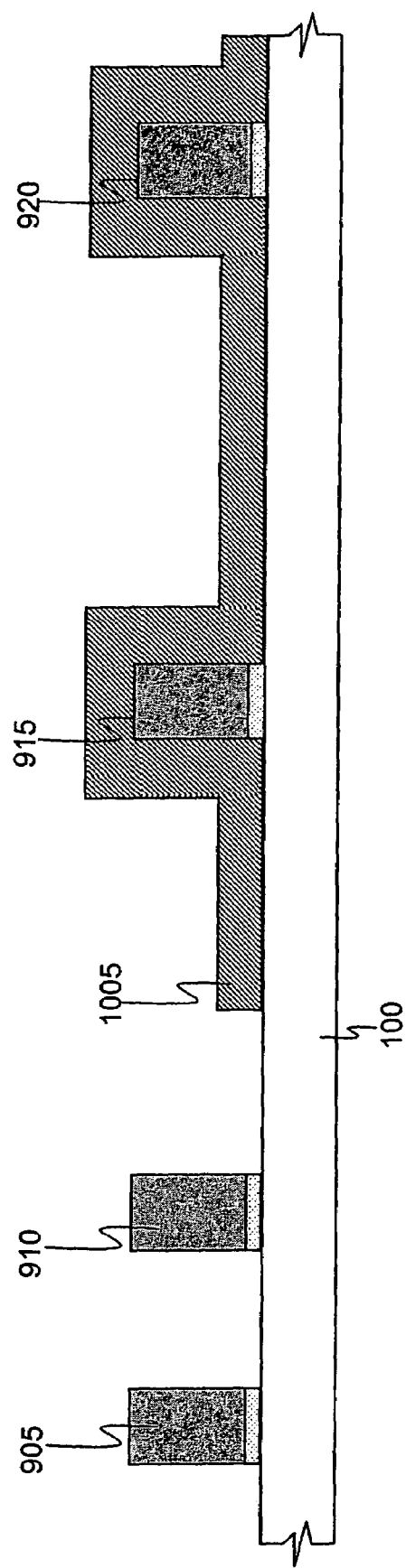
FIG. 11 shows the thick tensile stress layer removed from all areas except the group of distantly spaced nFETs.

Next, the thick tensile film 1005 is masked on locations where the isolated nFETs 915, 920 are present, to allow removal from all other areas of the substrate 100. For example, the desired pattern of nFETs 915, 920 may be transferred to an optical mask in a conventional manner. The surface of the substrate 100 may then be covered with photoresist. The resist may then be exposed through the mask to radiation that changes its structure, polymerizing (i.e., cross linking) determined areas. Unpolymerized regions may then be removed using a solvent, leaving the polymerized portions in tact. Subsequent process steps (e.g., etching) will affect only the areas without polymerized photoresist. Thus, the thick tensile film 1005 may be removed by etching (e.g., by reactive ion etching using the patterned photoresist as a mask) from all areas (e.g., 905, 910) except where the patterned nFETs 915, 920 are present, as shown in FIG. 11. Subsequently, the polymerized photoresist may be removed using a wet process, such as sulfuric acid, or a dry process, such as O$_2$ plasma.

Subsequently, another oxide liner layer (not shown) may be deposited over the top surface of the entire device to serve as an etch stop, before the next stress layer is applied, as discussed below. The oxide liner guards against unintended etching of elements beneath it, including thick tensile stress layer 1005. Alternatively, a timed etch, such as a timed dry etch, may be used to remove only the next layer from those areas of the substrate 100 that do not benefit from the stress imparted by the next layer.

Figure 12:
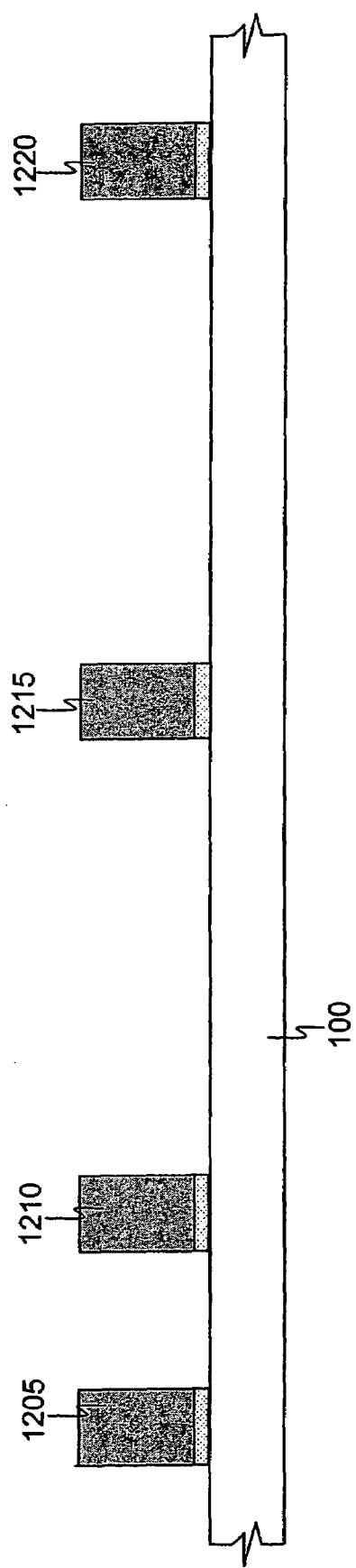
FIG. 12 shows a plurality of FETs, including a group of distantly spaced pFETs, on a semiconductor device.
Figure 13:
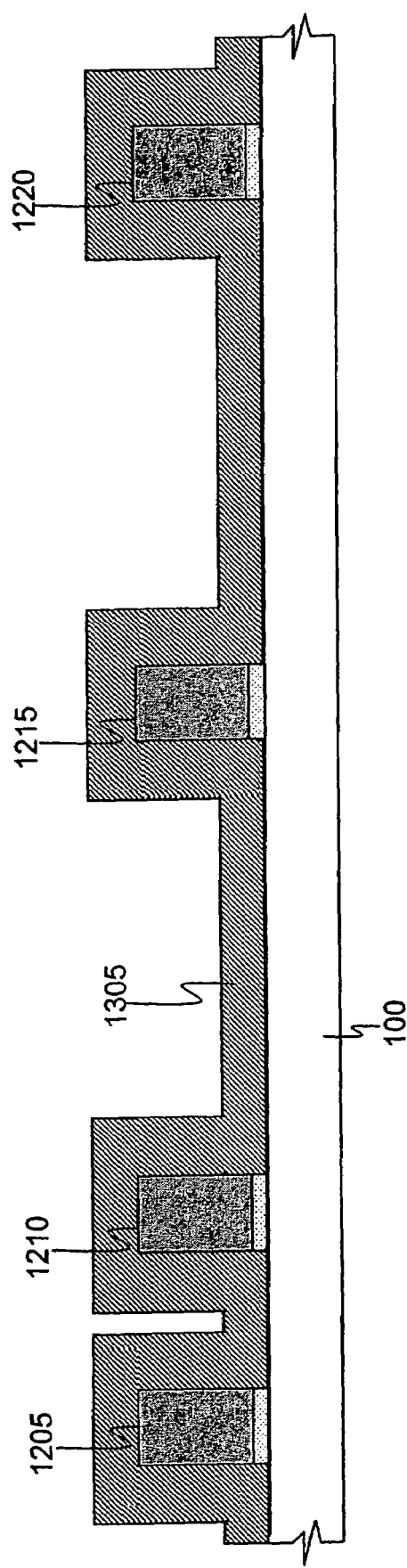
FIG. 13 shows a thick compressive stress layer applied to the plurality of FETs from FIG. 12, including the group of distantly spaced pFETs.

Referring now to FIG. 12, a sparsely populated group of (i.e., a group of distantly spaced) pFETs 1215, 1220 and a dense group of pFETs 1205, 1210 are shown. The distantly spaced pFETs may have spacings of greater than 130 nanometers, while the closely spaced FETs 1205, 1210 may have spacings of less than 130 nanometers. To impart a compressive stress to the pFETs 1215, 1220, particularly the channel region of the pFETs 1215, 1220, in accordance with the principles of the invention, a compressive stress layer 1305 is applied to the surface of the entire substrate 100, as shown in FIG. 13. Because the pFETs 1215, 1220 are separated by a relatively substantial distance, a thick stress layer 1305 of about 50 to 500 nanometers in thickness may be applied without substantial risk of void formation.

The thick compressive film 1305 may be comprised of, for example, Si$_3$N$_4$. The thick compressive film may also be, for example, Si$_x$N$_y$, and/or silicon oxynitride Si$_x$ON$_y$. The film 1305 may be blanket deposited over the entire surface of the substrate 100 in a conventional manner, such as by CVD, plasma enhanced CVD or PVD. In one implementation, the thick compressive film may have a thickness between 50 to 300 nanometers. The thick compressive film 1305 may exhibit a compressive stress of approximately −600 to −1500 MPa (Mega-pascals). The film 1305 is thus configured to impart a compressive stress to underlying areas.

Figure 14:
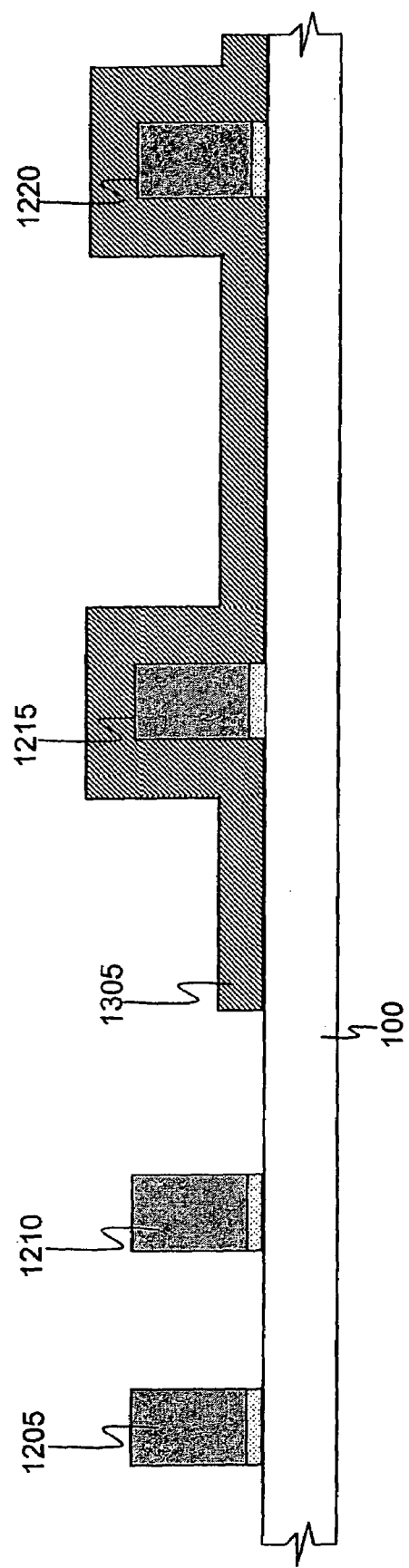
FIG. 14 shows the thick compressive stress layer removed from all areas except the group of distantly spaced pFETs.

Next, the thick compressive film 1305 is masked on locations where the isolated pFETs 1215, 1220 are present, to allow removal from all other areas (e.g., 1205, 1210) of the substrate 100. For example, the desired pattern of pFETs 1215, 1220 may be transferred to an optical mask in a conventional manner. The surface of the substrate 100 may then be covered with photoresist. The resist may then be exposed through the mask to radiation that changes its structure, polymerizing (i.e., cross linking) determined areas. Unpolymerized regions may then be removed using a solvent, leaving the polymerized portions in tact. Subsequent process steps (e.g., etching) will affect only the areas without polymerized photoresist. Thus, the thick compressive film 1305 may be removed by etching from all areas except where the patterned pFETs 1215, 1220 are present, as shown in FIG. 14. Subsequently, the polymerized photoresist may be removed using a wet process, such as sulfuric acid, or a dry process, such as O$_2$ plasma.

The order of applying the various stress layers is not critical. Compressive layers may be applied before or after tensile layers. Thick layers may be applied before or after thin layers.

In an alternative implementation, thick layers may be reduced via timed etching to produce thin stress layers over a densely populated areas. Thus, for example, a thick compressive layer may be applied for all pFETs. The compressive layer may then be removed from all areas that do not benefit from compressive stress such as, for example, areas populated with nFETs. Such removal may be carried out in the manner described above. In areas densely populated with pFETs, the compressive layer may be reduced in thickness through a wet or dry timed etch. The reduced thickness may be, for example, 20 to 50 nanometers. Isolated pFET areas may be protected with a photoresist or etch stop to avoid undesired removal and thinning of the compressive layer.

In another alternative implementation, thin compressive layers may be applied and built-up in successive layers to achieve desired thicknesses. Thus, for example, a thin tensile layer of approximately 20 to 50 nanometers may be applied for all nFETs. Subsequently, one or more additional thin tensile layers, each of approximately 20 to 50 nanometers, may be applied for isolated nFETs. The additional thin tensile layers may be removed from all areas that would be susceptible to void formation or that do not benefit from tensile stress, such as areas populated by pFETs. Such removal may be carried out in the manner described above.

While the invention has been described in terms of exemplary embodiments, those skilled in the art will recognize that the invention can be practiced with modifications and in the spirit and scope of the appended claims.

What is claimed is:

1. A process of forming a semiconductor structure, comprising:
   forming a plurality of high and low density areas of nFETS and pFETs on a substrate, the high density areas exhibiting a gate to gate distance of 130 nanometers or less and the low density areas exhibiting a gate to gate distance of greater than 130 nanometers;
   forming a thin compressive film of at least one of $Si_xN_y$ and $Si_xON_y$ in a range of 20 to 50 nanometers in channel regions of the high density areas of pFETs exhibiting a compressive stress of approximately −1400 MPa;
   forming a thin tensile film of at least one of $Si_xN_y$ and $Si_xON_y$ in a range of 20 to 50 nanometers in channel regions of the high density areas of nFETs;
   forming a thick compressive film of at least one of $Si_xN_y$ and $Si_xON_y$ in a range of 50 to 500 nanometers in channel regions of the low density areas of pFETs;
   forming a thick tensile film of at least one of $Si_xN_y$, and $Si_xON_y$ in a range of 50 to 500 nanometers in channel regions of the low density areas of nFETs exhibiting a tensile stress of approximately 700 Mpa,
   wherein the forming of the thick tensile film includes providing:
      a temperature of approximately 480° C., a pressure of approximately 6.25 Torr, a spacing between the substrate and electrode of 490 mils, and a flow of 300 sccm of 2% dilute $SiH_4$ gas, 15 sccm $NH_3$ gas and 1060 sccm $N_2$ gas using RF power of 340 watts, and
   wherein the forming of the thin compressive film includes providing:
      a temperature of approximately 480° C., a pressure of approximately 5.75 Torr, a spacing between the wafer and the electrode of 395 mils, and a flow of 3000 sccm of 2% dilute $SiH_4$ gas, 15 sccm $NH_3$ gas and 1060 sccm $N_2$ gas using RF power of 900 watts.

2. The process of claim 1, wherein the 20 to 50 nanometer thickness of the thin compressive film does not pose a substantial risk of void formation.

3. The process of claim 1, wherein the 20 to 50 nanometer thickness of the thin tensile film does not pose a substantial risk of void formation.

4. The process of claim 1, wherein a compressive stress of the thin compressive film enhances performance of the high density areas without materially degrading performance of the low density areas and a tensile stress of the thin tensile film enhances performance of the high density areas without materially degrading performance of the low density areas.

5. The process of claim 1, wherein the thin compressive film and the thin tensile film are formed by one of a CVD process, a plasma enhanced CVD process and a PVD process.

6. The process of claim 1, wherein the thick compressive film and the thick tensile film are formed by one of a CVD process, a plasma enhanced CVD process and a PVD process.

7. The process of claim 1, wherein each of the thin and thick tensile and compressive films are formed by deposition on an $SiO_2$ liner.

8. The process of claim 1, wherein the process produces a tensile stress that enhances electron mobility in the nFETS without materially degrading performance of the pFETS and a compressive stress that enhances hole mobility in the pFETS without materially degrading performance of the nFETS.

9. The process of claim 1, wherein each of the thin and thick compressive films are formed before each of the thin and thick tensile films.

10. The process of claim 1, wherein each of the thin and thick tensile films are formed before each of the thin and thick compressive films.

11. The process of claim 1, wherein each of the thin compressive and tensile films are formed before each of the thick compressive and tensile films.

12. The process of claim 1, wherein each of the thick compressive and tensile films are formed before each of the thin compressive and tensile films.

* * * * *